United States Patent [19]

Baggen

[11] Patent Number: 4,675,870
[45] Date of Patent: Jun. 23, 1987

[54] METHOD OF AND APPARATUS FOR DECODING A DATA STREAM WHICH IS PROTECTED BY A MULTI-SYMBOL ERROR PROTECTION CODE

[75] Inventor: Constant P. M. J. Baggen, Eindhoven, Netherlands

[73] Assignee: U.S. Philips Corporation, New York, N.Y.

[21] Appl. No.: 747,523

[22] Filed: Jun. 21, 1985

[30] Foreign Application Priority Data

Dec. 17, 1984 [NL] Netherlands ..................... 8403818

[51] Int. Cl.$^4$ ............................................. G06F 11/10
[52] U.S. Cl. ........................................ 371/39; 371/13; 371/35
[58] Field of Search ................ 371/13, 35, 38, 39, 371/40

[56] References Cited

U.S. PATENT DOCUMENTS

| | | | |
|---|---|---|---|
| 3,646,518 | 2/1972 | Weinstein | 371/35 |
| 4,344,171 | 8/1982 | Lin et al. | 371/35 |
| 4,506,362 | 3/1985 | Morley | 371/13 |
| 4,535,455 | 8/1985 | Peterson | 371/13 |
| 4,549,295 | 10/1985 | Purvis | 371/13 |
| 4,551,839 | 11/1985 | Botrel et al. | 371/35 |
| 4,584,685 | 4/1986 | Gajjar | 371/35 |

*Primary Examiner*—Charles E. Atkinson
*Attorney, Agent, or Firm*—Thomas A. Briody; Jack Oisher; William J. Streeter

[57] ABSTRACT

During the decoding of channel symbols included in multi-symbol code words in a data stream which is protected by a multi-symbol error correcting code such as a Reed-Solomon code, all channel symbols are first demodulated to derive the corresponding code symbols and a first indicator flag indicates whether or not the demodulation is reliable. All code symbols of a code word are subsequently collected, after which decoding is commenced to decode such code symbols and if correction of incorrect symbols of a code word is possible the code word is corrected. The decoding reliability of the corrected code word is indicated by a second indicator flag. If the corrected code word is unreliable, the stream of channel symbols is addressed again. During the latter operation, only the unreliably demodulated code symbols are replaced by new code symbols in order to enable renewed decoding of the code word.

4 Claims, 1 Drawing Figure

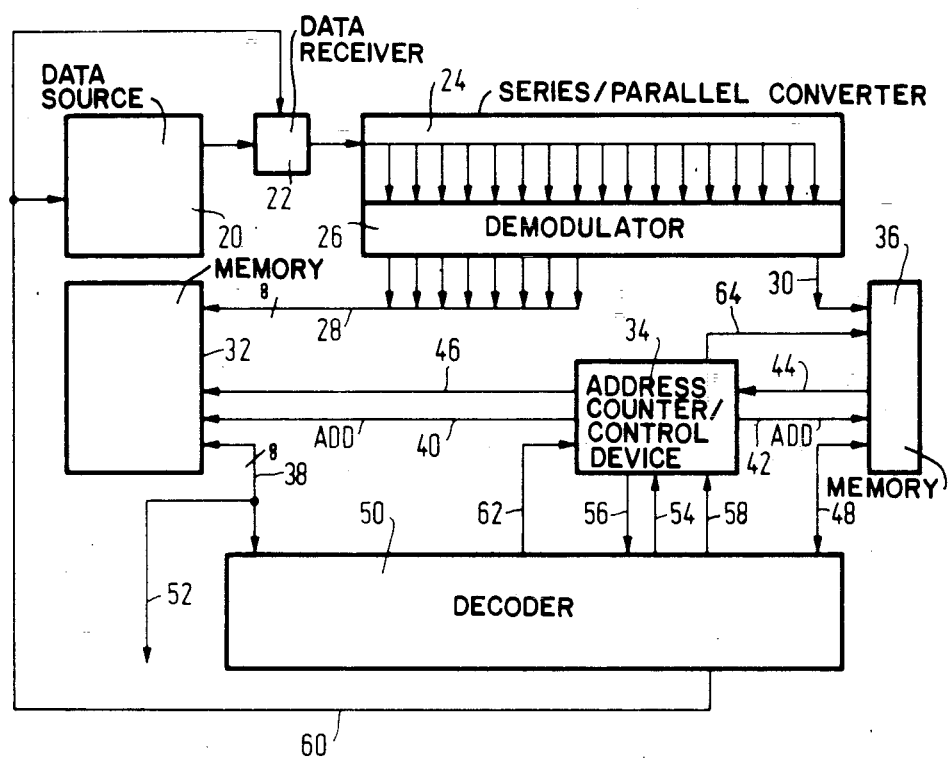

METHOD OF AND APPARATUS FOR DECODING A DATA STREAM WHICH IS PROTECTED BY A MULTI-SYMBOL ERROR PROTECTION CODE

BACKGROUND OF THE INVENTION

1. Field of the Invention

The invention relates to a method of decoding channel symbols included in multi-symbol code words in a data stream which is protected by a symbol error correcting code such as a Reed-Solomon code, including the steps of:

a. sequentially receiving the channel symbols of the code word;

b. demodulating the channel symbol so as to form corresponding code symbols corresponding thereto with indication of the reliability of the demodulation by means of an at least bivalent first indicator flag;

c. collecting the code symbols corresponding to the complete code word in an intermediate memory; and d. decoding the code symbols to recover the corresponding code word and correcting an unreliably decoded code word by means of redundancy symbols which are included in the code symbols, with indication of the decoding reliability of the corrected code word by means of a second multivalent indicator flag.

2. Description of the Related Art

Such a method is known from the previous Netherlands Patent Application No. 8200207, corresponding to U.S. Pat. No. 4,477,903, issued Oct. 16, 1984, assigned to applicant's assignee. Solomon codes, are also well know. By means of such codes, within a code word of n symbols t incorrect symbols can be located and corrected. Furthermore, e incorrect symbols can be corrected subject to the condition that the locations are known. Finally, d incorrect symbols can be detected. When a code word contains $(n-k)$ redundant symbols, it holds good that $(n-k) \geq 2t+d+e$. Often multiple symbol correcting codes such as Reed-solomon codes are used. Two principles are known in this respect. According to the interleaving principle, successive code symbols of a first code word are distributed, by introducing respective different time delays, between a number of code symbols of a second code word, said number being equal, for example, to the number of code symbols contains in the first code word. In accordance with the product code principle, a group of code symbols is divided into sub-groups in two or more different manners, a code word being formed from each sub-group by the addition of redundant symbols (one or more per sub-group). A substantial number of the code symbols then belong to two (or possibly more) different code words. The channel symbols are derived from the code symbols in accordance with given restrictions in order to adapt the information stream to the transmission capacity of the channel. Examples of such restrictions are:

a lower limit exists as regards the distance between two successive signal transitions in the channel, an upper limit exists as regards this distance, the channel signal has no or only a small DC component, certain channel symbols may be forbidden for reasons other than transmission capacity.

In accordance with the present state of the art, successive channel symbols are separated by three spacing bits. However, in certain applications more spacing bits may be present, or such bits may be absent.

According to the above identified patent, fourteen-bit channel symbols are converted into eight-bit code symbols during demodulation. Furthermore, a flag bit indicates whether the decoding is reliable or unreliable. The latter indication is given when the channel symbol does not comply with one or more of the above restrictions. The spacing bits, which must also satisfy the modulation rules, may or may not be taken into account for the evaluation decoding of the quality. The quality may also be determined on the basis of other properties of the channel signal; for example, the frequency spectrum or the presence of sufficient signal power for a given frequency band, Consequently, the indication given by the flag may have three or more possible values.

Upon decoding, usually first the error-indicating or "syndrome" symbols are formed and on the basis thereof it is decided whether or not a correction is necessary. The correction can usually be performed correctly; however in some cases correction will be impossible because the code word contains too many incorrect code symbols.

SUMMARY OF THE INVENTION

It is an object of the invention to enhance the decoding reliability and to restrict the additional effort required, such as calculation time, for error correction, while offering a high probability that the decoding will correct during a second read operation. This object is achieved in accordance with the invention in that when the second indicator flag indicates unreliable decoding, the information stream is addressed again and the collected code symbols are replaced by newly demodulated specimens of the same code symbol under the selective control of a first indicator flag which indicated unreliable demodulation of the already stored code symbols.

In particular embodiments a collected code symbol is replaced only when the corresponding, newly demodulated symbol is indicated as having been reliably demodulated. The replacement of all unreliably demodulated code symbols does not necessitate the advance signalling of the reliability of the demodulation during the second read operation. The exclusive replacement of incorrectly demodulated symbols by correctly demodulated code symbols permits a smaller number of write operations in the intermediate memory.

The invention also relates to a circuit for performing the above method.

BRIEF DESCRIPTION OF THE DRAWINGS

The invention will be described in detail hereinafter with reference to the sole FIGURE, which shows a block diagram of a circuit in accordance with the invention.

DESCRIPTION OF THE PREFERRED EMBODIMENTS

Block 20 in the FIGURE represents a data source. This may be a data connection to a transmitter station, a storage medium, for example a tape recorder, a playback apparatus for a disc-shaped storage member, or otherwise. The storage medium may be of a read-only type or of a read-write type. The information detection can be magnetic, optical or otherwise. In the case of a disc-shaped medium, a rotary drive is provided. The same information can then be addressed again during the next revolution. In the case of a tape-storage medium there will be a winding and rewinding facility. When the medium is a transmitter station, a mechanism will be provided for requesting the transmitter station to repeat the transmission of a specific quantity of information. The storage medium may also have random access memory (RAM) features. Element 22 is an input member which receives a signal from the data source and which comprises suitable input equipment for this purpose, for example an aerial, a magnetic read head or a laser-type read member, depending on the medium, and also an amplifier, discriminator and the like in order to produce a stream of channel bits on its output. There is also provided a synchronization mechanism which, however, has been omitted for the sake of simplicity; the connections thereof to the other parts of device have also been omitted.

The demodulation operation of apparatus used in the "Compact Disc" system (see Philips Technical Review, Vol. 40, No. 6, 1982) will be described by way of example. In the case of audio data, processing must take place in real time, and emergency steps are feasible should error correction be impossible. Such an emergency step would be to abstain from converting into an audio signal a data symbol which is known to the incorrect; the audio signal being determined instead from one or more neighbouring, correct audio signal values by way of an interpolation mechanism. For the storage of data, real-time processing of the information received is not strictly necessary, but then the requirements imposed as regards appropriate correction are more severe because the interpolation principle is not applicable. Therefore, it has been proposed to provide a further error protection level, again utilizing error correcting codes such as the Reed-Solomon codes, as in previous Japanese Patent Applications Nos. 84-57595 and 84-57596 filed in the name of Sony Corporation. Processing of the code used in the "Compact-Disc" system will first be described.

Element 24 is a series-parallel converter which produces in parallel seventeen successive channel bits corresponding to a channel symbol plus three spacing bits, and supplies them to a demodulator 26. The modulation restriction is that the "run length" between successive transitions in the stream of channel bits may not be less than three bits and not more than eleven bits. The spacing bits also satisfy the modulation rule and minimize the DC component of the channel signal. The demodulator comprises, for example, a read-only memory or programmable logic array having 17 inputs. If the channel symbol and spacing bits satisfy the modulation rules, the corresponding eight-bit data symbol is output on line 28 and a reliability flag "OK" appears on line 30. When the modulation rules are not satisfied, the symbol HEX$\phi\phi$ appears on the line 28 and a flag $\overline{\text{OK}}$ on the line 30. Element 24 is an control counter/address device. This device addresses memories 32 and 36 by way of identical addresses on lines 40 and 42, respectively, and thus compensates for the known interleaving effects of the storage on the "Compact Disc". Successive code symbols of a code word are thus stored in successive locations in the memory; however, this is not strictly necessary. In eaction thereto, each time a write control signal is produced on lines 46, 30. When the code symbols of the relevant code word have been completely received, the address counter/control device 34 applies a signal "ready" to a decoding device 50 via a line 56. The code symbols are then successively applied to the decoding device 50 over the lines 38, 48, using write control signals on line 46. The decoding operation itself will not be described in detail herein; in this respect reference is made to published Netherlands Patent Application No. 8400630 corresponding to applicant's co-pending, U.S. patent application Ser. No. 653,255, filed Sept. 24, 1984, assigned to applicant's assignee. The flag information on the line 48 can then act as locator information for suspect symbols. The decoding commences by the determination of the syndrome symbols, and in many cases these symbols will indicate that no error has occurred. The determination of the syndrome symbols can in principle commence as soon as any code symbol of the relevant code word is present. If no error has occurred, the code symbols (minus redundant symbols) can be applied to a user device via line 52, and a further signal OK will appear on line 54. Any necessary correction can be performed in the decoding device. It is alternatively possible to calculate only the corrections and to fetch only the symbols to be corrected once more from the memory 32 for this purpose. The memory addresses to be generated for this purpose by the encoding device are applied, over connection 62, to the address counter/control device 34 which applies these addresses to the memory 32. If necessary, after correction an indicator flag relating to the relevant symbol can be set to the state "reliable". Another solution is to maintain the original indicator flag and to use an additional indicator flag to indicate that the relevant code symbol has been corrected. After completion of the correction, the relevant word can be output again over the line 52. When the word is uncorrectable because of an excessively large number of incorrect symbols and/or erase symbols, the information "repeat" appears on the lines 58/60 when this situation is detected in the decoding device. Consequently, in a rotary system, a waiting period occurs to present the same information locations in the next revolution to the pick-up element (so-called revolution error), so that the mean processing speed is reduced. This will not be objectionable in many cases, because the time required for the processing of seriously incorrect code words is in any case much longer than the presentation time to the element 22. When this occurs several times in succession, an overflow condition arises in the memories, 32, 36 and a further waiting period must be inserted until free locations become available again. When a "repeat" operation is initiated, the read head is maintained in its original radial position with respect to the disc or is returned thereto. Subsequently, the channel symbols are read and demodulated again. The address counter 34 is reset to a previous position which corresponds to the position during previous presentation of the relevant symbols. At the word level this previous position is detected by given synchronization information which is also stored on the disc. This information may be, for example, a starting or index angle information which passes the head once during each revolution. Alternatively, a synchronization pattern may be stored several times per revolution, said patterns being detected by a detection circuit and being counted by a separate counter which has been omitted for the sake of simplicity. The storage pattern of the information in the intermediate memory 32, for example, can be repeated exactly once per revolution; the memory 32 then has a capacity corresponding to all code symbols of one revolution. Alternatively, the storage capacity of the memory 32 may be smaller. In that case several strategies are feasible. One solution is to continue the decoding permanently and to provide an index memory in the control device 34 which ascertains which word locations in the memory 32 are occupied by still insufficiently decoded words as well as by which words. The identity can be represented as a relative address with respect to the starting index. The search for a new empty word location can be associatively performed in this index memory.

During such repeats the memory 36 operates in a read modify/write mode. The memory 32 operates in a conditional write mode. When the indication bit in the memory 36 indicates that demodulation was reliable for the relevant symbol, the control signal "no operation" (NOP) appears on the line 46. The same signal appears in the write (second) part of the memory cycle for the memory 36. When the indication bit in the memory 36 indicates that the demodulation for the relevant code symbol was unreliable, the control signal "write" (WR) appears on the line 46. For the memory 36 the new value of the indicator flag is written during the second part of the memory cycle. Generally, the demodulation will now be reliable in the case of "soft" errors. In some cases, notably in the case of "hard" errors, the demodulation will again be unreliable. The write operation in the memory 32 can then also be inhibited. A special advantage can be obtained when a separate memory is provided for the storage of the addresses of the modified code symbols. This can be performed, if desired, by providing a separate bit in the memory 36 which has a width of two (or more) code bits, said additional bit being associatively interrogated. The further determination of the remaining modifications is thus facilitated.

The foregoing can be used in a similar manner for the various levels of Reed-Solomon codes. In some cases the code symbols of all sub-groups of a group which were unreliably demodulated can be stored again during a second read operation. This is because it has been found that the correction capability within the group as a whole exhibits a given coherence between the sub-groups or codewords: for a given code word it is codependent on the number of errors in words having one or more code symbols in common with a previous code word. The advantage of modifying only previously unreliably demodulated symbols is that the total number of errors is reduced. In some cases the calculation can also be simplified by taking into account the contribution of the modified symbols as a differential quantity in the calculations. Many calculation steps are thus simplified during the second read operation.

What is claimed is:

1. A method of decoding channel symbols comprised in multi-symbol code words in a data stream which is protected by symbol error correcting code, including the steps of:
   a. sequentially receiving the channel symbols of a code word;
   b. demodulating the channel symbols so as to form corresponding code symbols, with indication of the reliability of the demodulation by means of a first at least bivalent indicator flag;
   c. storing the code symbols corresponding to the complete code word in an intermediate memory;
   d. decoding the stored code symbols of the code word corresponding thereto and, if correction of unreliably decoded code symbols is possible, correcting such code word by means of error-correcting redundancy symbols which are included in the code symbols and indicating the decoding reliability of the corrected code word by means of a second at least bivalent indicator flag; and
   e. when the second indicator flag indicates unreliable decoding of the corrected code word, again addressing the data stream and replacing the stored code symbols with newly demodulated code signals under the selective control of the first indicator flag which indicated unreliable demodulation of a code symbol previously stored in the intermediate memory.

2. A method as claimed in claim 1, characterized in that a stored code symbol is only replaced if the corresponding newly demodulated code symbol is indicated as having been reliably demodulated.

3. Apparatus for decoding channel symbols comprised in multi-symbol code words in a data stream which is protected by symbol error correcting code, comprising:
   a. input means for sequentially receiving the channel symbols of a code word;
   b. a demodulator coupled to the input means and having code symbol outputs and a flag symbol output, for demodulating the received channel symbols into corresponding code symbols and indicating the reliability of such demodulation by means of a first at least bivalent indicator flag;
   c. a random access intermediate memory connected to the demodulator for storing the successive code symbols corresponding to a complete code word and the associated first indicator flag;
   d. a decoding device connected to the memory for decoding the stored code symbols of the corresponding complete code word and, if correction of unreliably decoded code symbols is possible, correcting such code word by means of error-correcting redundancy symbols included in the code symbols and indicating the reliability of the corrected code word by means of a second at least bivalent indicator flag;
   e. an output device connected to the decoding device at which the decoded code word is produced; and
   f. a control element connected to the decoding device for causing it to again activate the input means when the second indicator flag indicates unreliable decoding of the corrected code word, thereby causing the demodulator to again demodulate the channel symbols of the original code word;
   said control element comprising a detector connected to the intermediate memory for receiving the first indicator flag and further comprising an output which enables the intermediate memory to substitute a newly demodulated code symbol for a code symbol stored therein only if such stored code symbol was indicated by the first indicator flag as being unreliable.

4. Apparatus as claimed in claim 3, characterized in that the control element enables the intermediate memory to replace a code symbol stored therein only when the second indicator flag indicates that the replacing code symbol was reliably demodulated during the second read operation.

* * * * *